United States Patent
Wu

(10) Patent No.: US 9,972,495 B1
(45) Date of Patent: May 15, 2018

(54) LOW-K DIELECTRIC SPACER FOR A GATE CUT

(71) Applicant: GLOBALFOUNDRIES Inc., Grand Cayman (KY)

(72) Inventor: Xusheng Wu, Ballston Lake, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days. days.

(21) Appl. No.: 15/387,984

(22) Filed: Dec. 22, 2016

(51) Int. Cl.
*H01L 29/66* (2006.01)
*H01L 29/78* (2006.01)
*H01L 21/28* (2006.01)
*H01L 21/8234* (2006.01)
*H01L 27/088* (2006.01)
*H01L 29/49* (2006.01)
*H01L 29/06* (2006.01)

(52) U.S. Cl.
CPC ............ *H01L 21/28123* (2013.01); *H01L 21/823431* (2013.01); *H01L 21/823468* (2013.01); *H01L 21/823481* (2013.01); *H01L 27/0886* (2013.01); *H01L 29/0653* (2013.01); *H01L 29/4983* (2013.01); *H01L 29/66545* (2013.01)

(58) Field of Classification Search
CPC .................................................. H01L 29/7855
See application file for complete search history.

(56) References Cited

U.S. PATENT DOCUMENTS

| | | | |
|---|---|---|---|
| 2013/0187206 A1* | 7/2013 | Mor | H01L 29/66628 257/288 |
| 2014/0252486 A1* | 9/2014 | Lin, Jr. | H01L 29/66795 257/365 |
| 2017/0243760 A1* | 8/2017 | Chao | H01L 21/44 |

\* cited by examiner

*Primary Examiner* — Asok K Sarkar
*Assistant Examiner* — Grant Withers
(74) *Attorney, Agent, or Firm* — Thompson Hine LLP; Francois Pagette

(57) ABSTRACT

Structures including one or more field-effect transistors and methods for forming a structure that includes one or more field-effect transistors. A first semiconductor fin and a second semiconductor fin are formed in which the second semiconductor fin is spaced from the first semiconductor fin. A semiconductor layer is formed that covers the first semiconductor fin and the second semiconductor fin. An opening is formed in the semiconductor layer that exposes the first semiconductor fin. A dielectric spacer is formed on at least one sidewall of the semiconductor layer bordering the opening.

15 Claims, 6 Drawing Sheets

US 9,972,495 B1

LOW-K DIELECTRIC SPACER FOR A GATE CUT

BACKGROUND

The present invention relates to semiconductor device fabrication and integrated circuits and, more specifically, to structures including one or more field-effect transistors and methods for forming a structure that includes one or more field-effect transistors.

A fin-type field-effect transistor (FinFET) is a non-planar device structure for a field-effect transistor that is capable of being more densely packed in an integrated circuit than planar field-effect transistors. A FinFET may include a fin consisting of a body of semiconductor material and a gate electrode that wraps about a central portion of the fin body. A FinFET further includes heavily-doped source/drain regions formed in sections of the fin body that are not overlapped by the gate electrode. The arrangement between the gate electrode and fin improves control of the channel and reduces the leakage current when the FinFET is in its 'off' state. This, in turn, enables the use of lower threshold voltages and results in better performance and power.

In some FinFET technologies, a gate cut is performed to interrupt the continuity of a dummy gate in order to divide the dummy gate into segments. The segmentation is reproduced with the dummy gate is replaced with the replacement metal gate. The gate cut may be performed after the interlayer dielectric fill is performed and the dummy gate is revealed by polishing for removal and replacement. Non-critical gate cuts are large in dimensions, and critical gate cuts are small in dimensions in comparison with non-critical gate cuts. As fin pitch scales downward, the critical gate cut at locations between fins is challenging with respect to process margin. Conventional gate cut patterning and etching process may cause fin damage, especially for critical gate cuts of small critical dimension. In addition, due to small sizing of the critical gate cut, incomplete pull of the dummy gate may reduce yield.

Improved structures including one or more field-effect transistors and methods for forming a structure that includes one or more field-effect transistors are needed.

SUMMARY

In an embodiment of the invention, a method includes forming a first semiconductor fin and a second semiconductor fin spaced from the first semiconductor fin, forming a semiconductor layer that covers the first semiconductor fin and the second semiconductor fin, and forming an opening in the semiconductor layer that exposes the first semiconductor fin. The method further includes forming a dielectric spacer on at least one sidewall of the first semiconductor layer bordering the opening.

In an embodiment of the invention, a structure includes a first functional gate structure, a second functional gate structure, and a dielectric spacer located between the first functional gate structure and the second functional gate structure. The dielectric spacer is comprised of a low-k dielectric material.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 3 is a top view in which FIG. 2 is taken generally along line 2-2.

FIG. 7 is a top view in which FIG. 6 is taken generally along line 6-6.

FIG. 10 is a top view in which FIG. 9 is taken generally along line 9-9.

DETAILED DESCRIPTION

Figure 1:
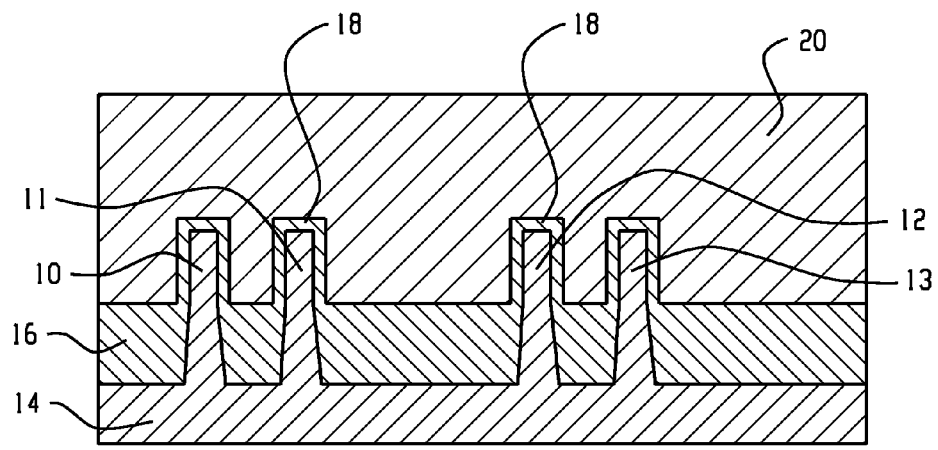
FIG. 1 is a cross-sectional view of a portion of a substrate at an initial fabrication stage of a processing method in accordance with embodiments of the invention.

With reference to FIG. 1 and in accordance with embodiments of the invention, fins 10, 11, 12, 13 are formed on a substrate 14 and trench isolation 16 is formed that provides electrical isolation for the fins 10-13 and other adjacent fins (not shown). The fins 10-13, which are arranged in parallel rows, may be formed from the semiconductor material of the substrate 14 by photolithography and etching processes, such as a sidewall imaging transfer (SIT) process that promotes dense packing. The substrate 14 may be a bulk substrate or a device layer of a semiconductor-on-insulator (SOI) substrate. The trench isolation 16 may be composed of, for example, silicon dioxide ($SiO_2$) deposited by chemical vapor deposition (CVD). The fins 10-13 have a parallel lengthwise arrangement.

A dielectric layer 18 composed of, for example, silicon dioxide ($SiO_2$), may be formed on the sections of the fins 10-13 that project above the top surface of the trench isolation 16. The dielectric layer 18 may be constituted by a dielectric material, such as silicon dioxide ($SiO_2$), that is grown by oxidizing the top surface of device layer 12 or deposited by CVD. A layer 20 composed of a semiconductor material, such as polysilicon (i.e., polycrystalline silicon), may be deposited by CVD and planarized using, for example, chemical mechanical polishing (CMP).

Figure 2:
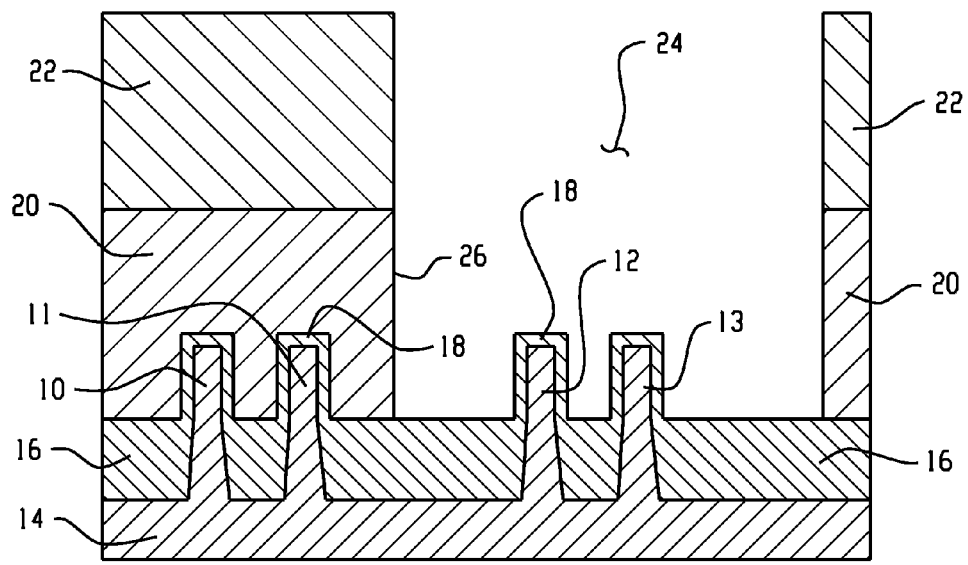
FIG. 2 is a cross-sectional view of the substrate portion at a fabrication stage subsequent to FIG. 1.
Figure 3:
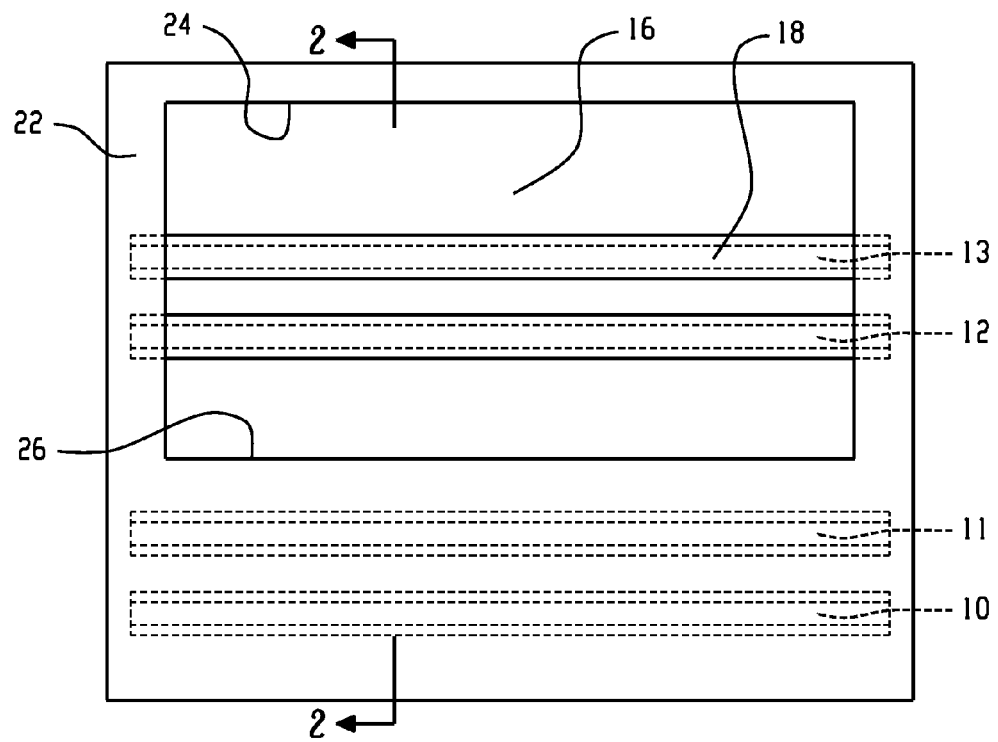

With reference to FIGS. 2, 3 in which like reference numerals refer to like features in FIG. 1 and at a subsequent fabrication stage, a hardmask layer 22 is formed on the top surface of the semiconductor layer 20. The hardmask layer 22 may be comprised of silicon nitride ($Si_3N_4$) deposited by CVD. The hardmask layer 22 is removable from the semiconductor layer 20 without inflicting damage to the semiconductor layer 20. The hardmask layer 22 is patterned using a photoresist mask and an etching process, such as reactive-ion etching (ME), that removes the material of the hardmask layer 22 selective to the material of the semiconductor layer 20. After the photoresist mask is stripped, the semiconductor layer 20 is patterned using the patterned hardmask layer as an etch mask and an etching process, such as ME, that removes the material of the semiconductor layer 20 selective to the materials of the trench isolation 16 and the dielectric layer 18. An opening 24 is defined in the patterned semiconductor layer 20 and hardmask layer 22 that extends through the thicknesses of the semiconductor layer 20 and hardmask layer 22. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process.

The fins 12, 13 and, more specifically, segments of the fins 12, 13 are revealed (i.e., unmasked) by the opening 24 formed in the semiconductor layer 20 and hardmask layer 22. The fins 10, 11 are completely covered (i.e., masked) by the patterned semiconductor layer 20 and hardmask layer 22. The opening 24 exposes an area on the top surface of the substrate 14 that is surrounded by sidewalls comprised of the semiconductor material of semiconductor layer 20, and inside which segments of the entire lengths of the fins 12, 13 are revealed. Sidewall 26 is included in the sidewalls of the opening 24, and is located horizontally between the masked fin 11 and the unmasked segment of fin 12. The sidewalls, including sidewall 26, of the patterned semiconductor layer 20 are aligned vertically with respective side edges of the patterned hardmask layer 22. The fins 12, 13 have covered respective segments that continue in length beneath the semiconductor layer 20 exterior of the boundary defined by the sidewall 26 and, therefore, are outside of the opening 24 and masked by the patterned semiconductor layer 20 and hardmask layer 22.

Figure 4:
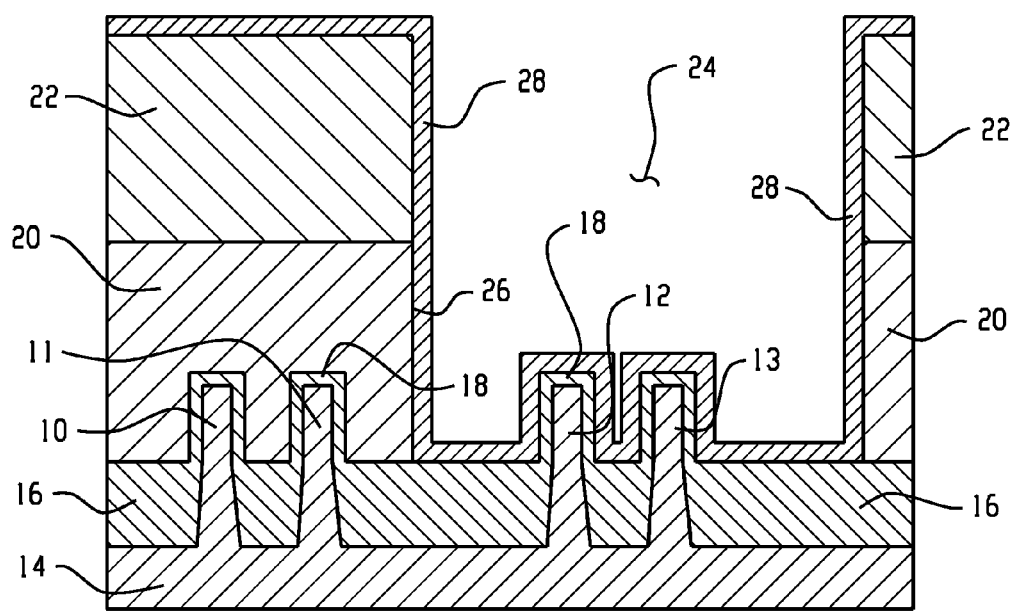
FIGS. 4-6 are cross-sectional views of the substrate portion at successive fabrication stages of the processing method subsequent to FIG. 2.

With reference to FIG. 4 in which like reference numerals refer to like features in FIGS. 2, 3 and at a subsequent fabrication stage, a conformal layer 28 is formed that covers the top surface and side edge of the hardmask layer 22, the sidewall 26 and the other sidewalls inside the opening 24 in the patterned semiconductor layer 20, the top surface of the trench isolation 16, and the exposed portions of the fins 12, 13. The conformal layer 28 may be composed of a low-k dielectric material, such as silicon boron carbide nitride (SiBCN), silicon oxycarbonitride (SiOCN), or silicon carbonitride (SiCN) deposited by atomic layer deposition (ALD). The low-k dielectric material selected for the conformal layer 28 has a higher etch rate than silicon nitride ($Si_3N_4$) for the same etch chemistry. The low-k dielectric material selected for the conformal layer 28 also exhibits etch selectivity relative to the dielectric layer 18 (e.g., silicon dioxide ($SiO_2$)) on the fins 10-13 such that the conformal layer 28 can be etched without removing the dielectric layer 18.

Figure 5:
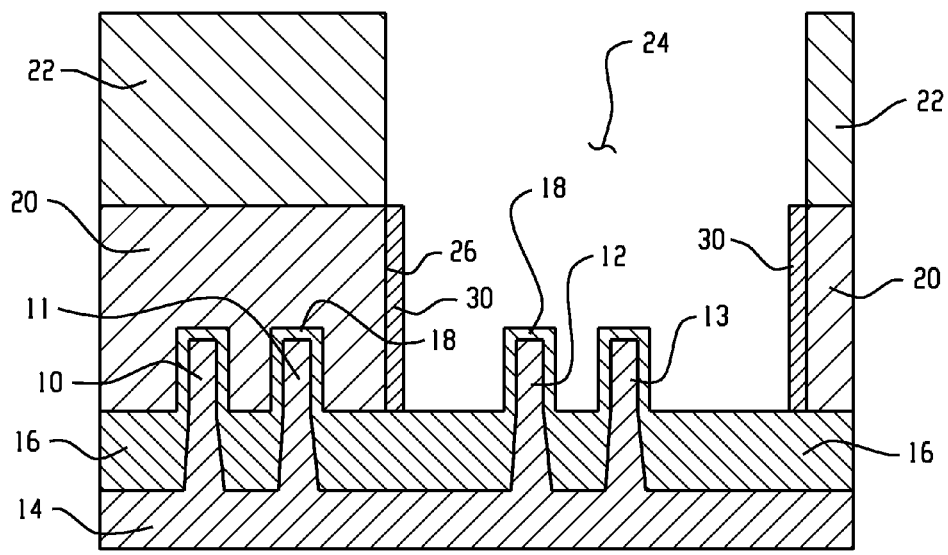

With reference to FIG. 5 in which like reference numerals refer to like features in FIG. 4 and at a subsequent fabrication stage, a dielectric spacer 30 is formed from the conformal layer 28 on all of the sidewalls, including sidewall 26, of the patterned semiconductor layer 20 bordering the opening 24. The dielectric spacer 30 is formed by shaping the conformal layer 28 with an anisotropic etching process, such as RIE, that preferentially removes the dielectric material of the conformal layer 28 from horizontal surfaces. An overetch may be used to ensure that the conformal layer 28 is completely removed from the vicinity of the fins 12, 13 and is only retained in the dielectric spacer 30. The overetch may recess the height of the dielectric spacer 30, but only to the extent that the spacer 30 covers the height of the top surface of the semiconductor layer 20 along the sidewalls of the opening 24.

Figure 6:
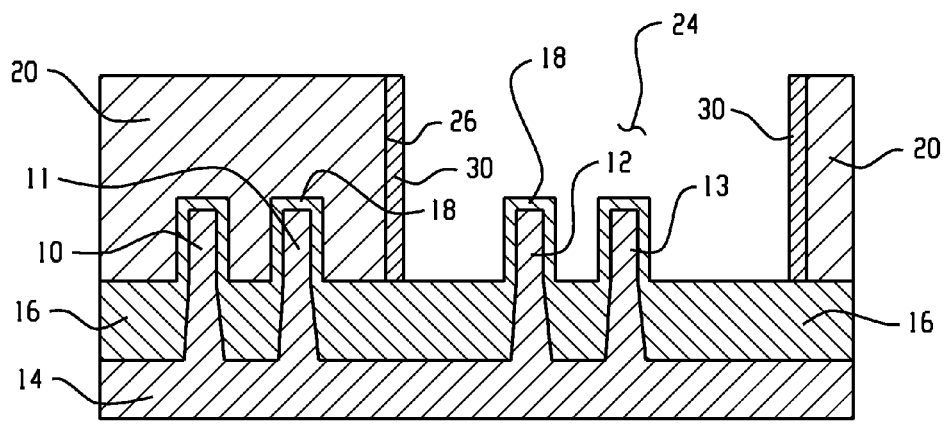
Figure 7:
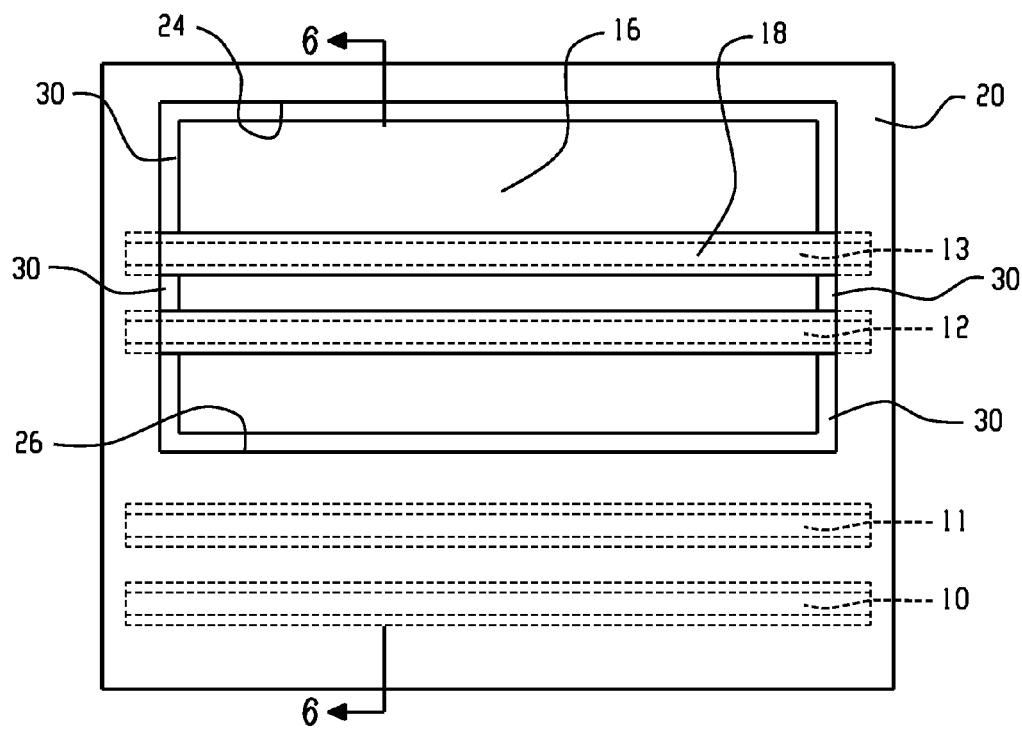

With reference to FIGS. 6, 7 in which like reference numerals refer to like features in FIG. 5 and at a subsequent fabrication stage, the hardmask layer 22 is removed selective to the trench isolation 16, the dielectric layer 18 on the fins 12, 13, the semiconductor layer 20, and the dielectric spacer 30 with an etching process. The top surface of the semiconductor layer 20 is again exposed by the removal of the hardmask layer 22. The dielectric spacer 30 extends about the interior of the opening 24 in the patterned semiconductor layer 20.

Figure 8:
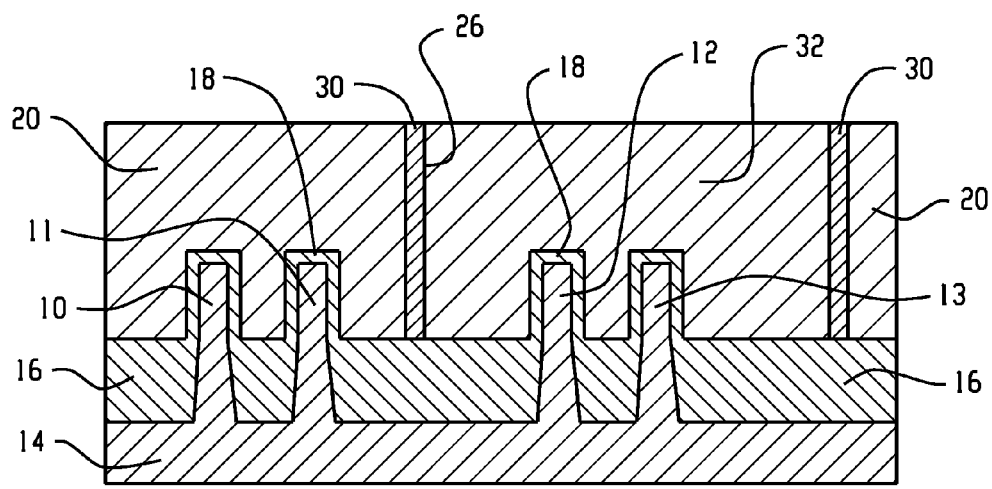
FIGS. 8 and 9 are cross-sectional views of the substrate portion at successive fabrication stages of the processing method subsequent to FIG. 6.

With reference to FIG. 8 in which like reference numerals refer to like features in FIGS. 6, 7 and at a subsequent fabrication stage, a layer 32 composed of a semiconductor material, such as polysilicon, may be deposited by CVD and planarized using, for example, CMP, to be coplanar with the semiconductor layer 20 and spacer 30. In an embodiment, the semiconductor layers 20, 32 are both composed of polysilicon. The dielectric spacer 30 is located as an intervening structure between the semiconductor layer 20 and the semiconductor layer 32, and the semiconductor layers 20, 32 each directly contact the spacer 30. The dielectric spacer 30 has a height, relative to the top surface of the trench isolation 16, that is equal to the thickness of the planarized semiconductor layers 20, 32 relative to the same horizontal reference.

Figure 9:
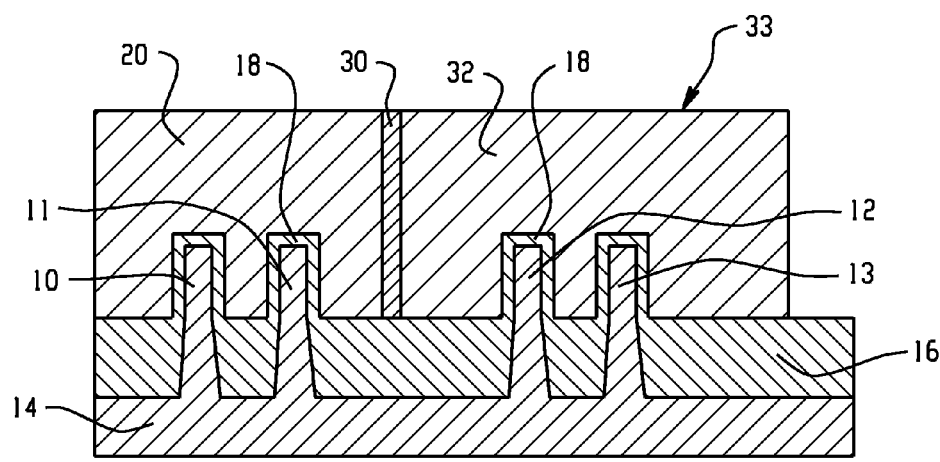
Figure 10:
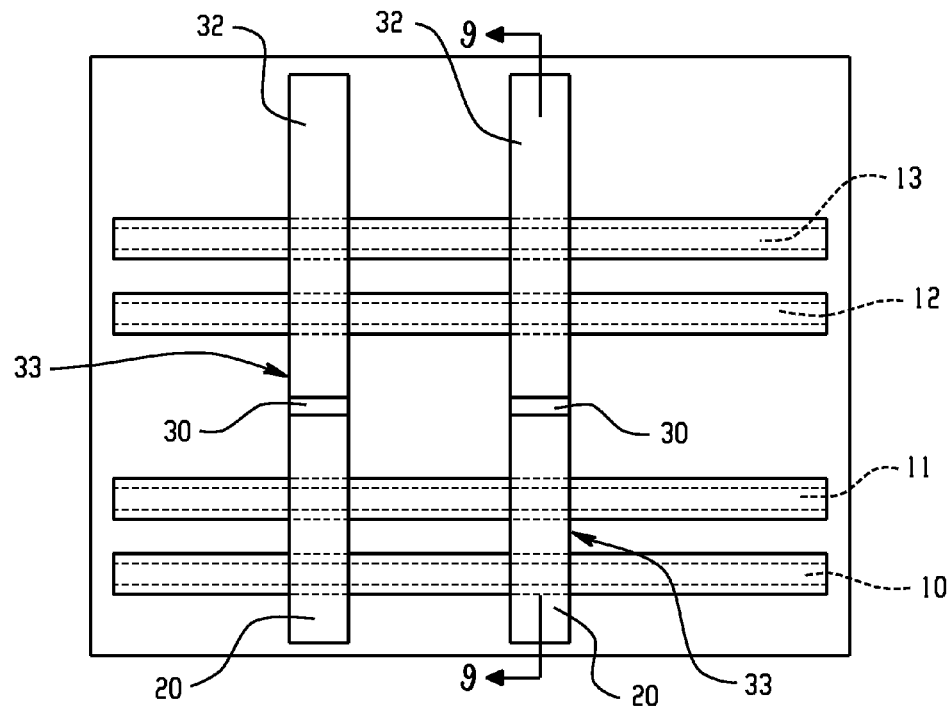

With reference to FIGS. 9, 10 in which like reference numerals refer to like features in FIG. 8 and at a subsequent fabrication stage, the semiconductor layers 20, 32 are patterned to define dummy gate structures 33 with an etching process, such as ME. The dummy gate structures 33 have a parallel arrangement and are aligned perpendicular to the fins 10, 11, 12, 13.

The dielectric spacer 30 is removed from the sidewalls of the opening 24, with the exception of sidewall 26 along the length of the dummy gate structures 33. Dielectric spacer 30 is retained on sidewall 26 due to masking with an etch mask when the dummy gate structures 33 are patterned, and is removed from the sidewall 26 between adjacent dummy gate structures 33 to form sections. Each dummy gate structure 33 includes a patterned section of the dielectric spacer 30 that is located between a patterned section of the semiconductor layer 20 and a patterned section of the semiconductor layer 32. The sections of the dielectric spacer 30 embedded inside of the dummy gate structures 33 are located horizontally between the fins 10, 11 and the fins 12, 13.

A non-critical mask of relatively large dimensions may be used to divide one or more of the dummy gate structures 33 into segments. Reliance upon the dielectric spacer 30 eliminates the need for a critical gate cut using a critical mask of relatively small dimensions that may require the application of an advanced technology to form. Effectively, reliance upon the dielectric spacer 30 eliminates a critical mask for the critical gate cut such that only a non-critical mask is needed to cut the dummy gate structures 33. The critical cut dimension is not limited by the resolution of lithography, but is instead limited by the ability to control the thickness of the conformal layer 28 deposited and etched to form the dielectric spacer 30.

Figure 11:
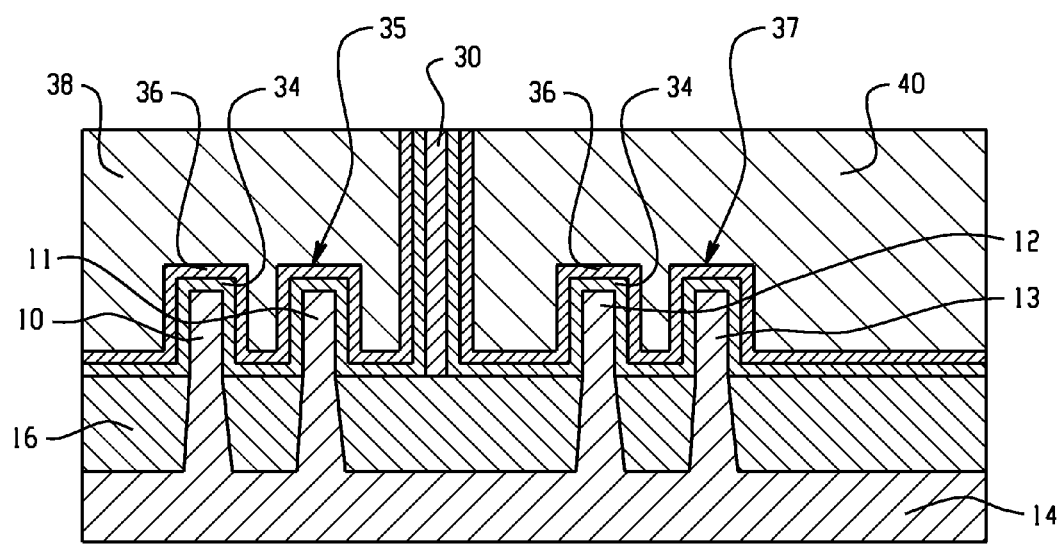
FIG. 11 is a cross-sectional view of the substrate portion at a fabrication stage of the processing method subsequent to FIG. 9.

With reference to FIG. 11 in which like reference numerals refer to like features in FIGS. 9, 10 and at a subsequent fabrication stage, as part of a replacement gate process, an interlayer dielectric layer (not shown) is deposited and planarized, and the dummy gate structures 33 are removed and replaced by functional gate structures 35, 37 of different field effect transistors 35, 37. The functional gate structures 35, 37 each include sections of a gate dielectric 34 and a metal gate layer 36. The dielectric layer 18 is removed from the fins 10-13 as part of the replacement gate process. The gate dielectric 34 composed of a high-k material, such as hafnium oxide, is deposited on the fins 10-13 and the surface of the trench isolation 16. The metal gate layer 36 comprised of a metal, such as aluminum or tungsten, is deposited by physical vapor deposition (PVD), CVD, etc. on the fins 10-13 atop the gate dielectric 34, and may also include one or more work function metal layers present to adjust the threshold voltage.

The gate dielectric 34 and metal gate layer 36 also form on the exterior surfaces of the dielectric spacer 30. As a result, the functional gate structures 35, 37 of the different field effect transistors directly contact the dielectric spacer 30. The gate dielectric 34 directly contacts the dielectric spacer 30, and the metal gate layer 36 indirectly contacts the dielectric spacer 30 due to the intervening positioning of the gate dielectric 34.

Silicidation, middle-of-line (MOL), and back-end-of-line (BEOL) processing follows, which includes formation of contacts and wiring for the local interconnect structure overlying the device structure, and formation of dielectric layers, via plugs, and wiring for an interconnect structure coupled by the interconnect wiring with the field effect transistors. In particular, contacts 38, 40, which may be comprised of a metal such as tungsten (W), are formed that are coupled with the metal gate layer 36. Contact 38 is coupled with a section of the metal gate layer 36 on one side of the dielectric spacer 30 and contact 40 is coupled with a section of the metal gate layer 36 on the opposite side of the dielectric spacer 30 such that the dielectric spacer 30 provides isolation for forming distinct field-effect transistors. Following planarization, the section of the metal gate layer 36 contacted by contact 38 defines a functional gate structure for a field-effect transistor, and the section of the metal gate layer 36 contacted by contact 40 defines a functional gate structure for another field-effect transistor that is isolated from the other field-effect transistor by the dielectric spacer 30. The dielectric spacer 30 remains intact during the performance of the gate module because the functional gate structures are formed with etching processes that are selective to the low-k dielectric material of the dielectric spacer 30.

Conventionally, the space between the different sections of the metal gate layer 36 is filled at the junction module by a section of a dielectric layer (e.g., silicon nitride ($Si_3N_4$)) that is clad by spacers. The composite thickness of the section of the dielectric layer and the spacers in a horizontal direction (i.e., perpendicular to the sidewall 26) is greater than or equal to 20 nanometers. In comparison, the thickness of the dielectric spacer 30 in a horizontal direction (i.e., perpendicular to the sidewall 26) can be less than or equal to 10 nanometers because of the manner in which the dielectric spacer 30 is formed. The dielectric spacer 30 is formed at the gate module, which is preformed subsequent to the junction module that forms raised source/drain regions for the field-effect transistors.

The term "sacrificial gate structure" as used herein refers to a placeholder structure for a functional gate structure to be subsequently formed. The term "functional gate structure" as used herein refers to a permanent gate structure used to control output current (i.e., flow of carriers in the channel) of a semiconducting device.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    forming a first semiconductor fin and a second semiconductor fin spaced from the first semiconductor fin;
    forming a first semiconductor layer that covers the first semiconductor fin and the second semiconductor fin;
    forming an opening in the first semiconductor layer that exposes the first semiconductor fin;
    forming a dielectric spacer on at least one sidewall of the first semiconductor layer bordering the opening;
    forming a second semiconductor layer that fills the opening and covers the first semiconductor fin; and
    patterning the first semiconductor layer and the second semiconductor layer to respectively form a first section and a second section of a dummy gate structure,
    wherein the dielectric spacer includes a section located between the first section of the dummy gate structure and the second section of the dummy gate structure.

2. The method of claim 1 wherein the dielectric spacer is comprised of a low-k dielectric material.

3. The method of claim 1 wherein the dielectric spacer is comprised of silicon boron carbide nitride (SiBCN), silicon oxycarbonitride (SiOCN), or silicon carbonitride (SiCN).

4. The method of claim 1 wherein the at least one sidewall of the opening is located horizontally between the first semiconductor fin and the second semiconductor fin.

5. The method of claim 1
    wherein the dielectric spacer is patterned when the first section of the dummy gate structure and the second section of the dummy gate structure are patterned.

6. The method of claim 5 further comprising:
replacing the first section of the dummy gate structure with a first functional gate structure; and
replacing the second section of the dummy gate structure with a second functional gate structure,
wherein the section of the dielectric spacer is located between the first functional gate structure and the second functional gate structure, and the section of the dielectric spacer electrically isolates the first functional gate structure from the second functional gate structure.

7. The method of claim 6 wherein the first functional gate structure extends across the first semiconductor fin, and the second functional gate structure extends across the second semiconductor fin.

8. The method of claim 6 wherein the first functional gate structure directly contacts the section of the dielectric spacer, and the second functional gate structure directly contacts the section of the dielectric spacer.

9. The method of claim 1 wherein forming the opening in the first semiconductor layer that exposes the first semiconductor fin comprises:
selectively removing the first semiconductor layer with a first etching process to form the opening.

10. The method of claim 9 further comprising:
forming a patterned hardmask layer on the first semiconductor layer,
wherein the patterned hardmask layer masks the first semiconductor layer outside of the opening during the first etching process.

11. The method of claim 10 wherein forming the dielectric spacer on the at least one sidewall of the opening comprises:
depositing a conformal layer of dielectric material on the at least one sidewall and the first semiconductor fin; and
removing the dielectric material of the conformal layer from the first semiconductor fin selective to the patterned hardmask layer with a second etching process that is anisotropic.

12. The method of claim 9 wherein the first semiconductor fin is covered by a dielectric layer, and the first semiconductor layer is removed selective to the dielectric layer by the first etching process.

13. The method of claim 1 wherein forming the dielectric spacer on the at least one sidewall of the opening comprises:
depositing a conformal layer of dielectric material on the at least one sidewall and the first semiconductor fin; and
anisotropically etching the dielectric material of the conformal layer to form the dielectric spacer.

14. The method of claim 1 wherein the dielectric spacer is located horizontally between the first semiconductor fin and the second semiconductor fin.

15. The method of claim 1 wherein the dielectric spacer has a thickness that is less than or equal to 10 nanometers.

* * * * *